US007936561B1

(12) United States Patent
Lin

(10) Patent No.: US 7,936,561 B1
(45) Date of Patent: May 3, 2011

(54) LED HEAT DISSIPATION ALUMINUM BAR AND ELECTRICITY CONDUCTION DEVICE

(76) Inventor: Ruei-Hsing Lin, Taipei Hsien (TW)

( * ) Notice: Subject to any disclaimer, the term of this patent is extended or adjusted under 35 U.S.C. 154(b) by 0 days.

(21) Appl. No.: 12/636,769

(22) Filed: Dec. 13, 2009

(51) Int. Cl.
*H05K 7/20* (2006.01)
*H01L 33/00* (2010.01)
*F21V 7/04* (2006.01)

(52) U.S. Cl. .............. 361/679.54; 361/679.46; 361/704; 361/709; 361/710; 361/719; 362/294; 362/373; 362/800; 29/428; 439/403; 439/404; 165/80.3; 165/185

(58) Field of Classification Search ............. 361/679.46, 361/479.47, 679.54, 704–712, 717–724, 361/754, 762; 165/80.3, 104.33, 185; 174/16.3, 174/252, 260, 50, 50.52; 257/98, 99, E33.061, 257/E33.075, 714, E33.058, 707, 712, 675, 257/930, E23.051; 439/403, 404; 29/428, 29/830, 832, 840, 890.33; 362/218, 231, 362/235–238, 240, 244, 245, 247, 294, 373, 362/800, 249.01, 249.02, 219, 547; 315/112, 315/117, 309, 316, 292
See application file for complete search history.

(56) References Cited

U.S. PATENT DOCUMENTS

| | | | | |
|---|---|---|---|---|
| 4,896,168 | A * | 1/1990 | Newman et al. | 347/245 |
| 5,136,639 | A * | 8/1992 | Brito | 379/441 |
| 6,472,823 | B2 * | 10/2002 | Yen | 315/112 |
| 7,217,004 | B2 * | 5/2007 | Park et al. | 362/240 |
| 7,244,058 | B2 * | 7/2007 | DiPenti et al. | 362/547 |
| 7,405,944 | B2 * | 7/2008 | Mayer et al. | 361/759 |
| 7,637,638 | B2 * | 12/2009 | Chen | 362/294 |
| 7,815,341 | B2 * | 10/2010 | Steedly et al. | 362/294 |
| 2008/0170371 | A1 * | 7/2008 | Lai | 361/720 |
| 2008/0180015 | A1 * | 7/2008 | Wu et al. | 313/46 |
| 2009/0190350 | A1 * | 7/2009 | Tseng et al. | 362/249.01 |
| 2009/0219713 | A1 * | 9/2009 | Siemiet et al. | 362/218 |

* cited by examiner

*Primary Examiner* — Michael V Datskovskiy
(74) *Attorney, Agent, or Firm* — Leong C. Lei

(57) ABSTRACT

A light-emitting diode (LED) heat dissipation aluminum bar and electricity conduction device includes a heat dissipation aluminum bar having a structure formed of multiple sections each having multiple heat dissipation fins. The heat dissipation aluminum bar forms a LED circuit board receiving slot and power channels and each power channel receives therein an insulation that encloses an electrically conductive bars. When an LED circuit board is received and secured in the LED circuit board receiving slot by fasteners, the fasteners, which are made electrically conductive, penetrate the insulations to contact the electrically conductive bars so as to supply electricity to the LED circuit board at the same time of fixing the LED circuit board. The LED circuit board has a structure formed of multiple sections interconnected to each other to allow for adjustment of the overall length thereof.

5 Claims, 3 Drawing Sheets

LED HEAT DISSIPATION ALUMINUM BAR AND ELECTRICITY CONDUCTION DEVICE

TECHNICAL FIELD OF THE INVENTION

The present invention relates to a light-emitting diode (LED) heat dissipation aluminum bar and electricity conduction device, which provides two purposes:

(1) A novel electricity conduction structure is provided by a heat dissipation aluminum bar for solving the problem of electricity transmission between a metallic heat dissipation aluminum bar and an LED circuit board. The transmission is done in a position constraint free manner for realizing efficient power distribution to one or multiple sections of the LED circuit board and thus solving the problems associated with electrical power source arranged with parallel and/or serial connection that requires arrangement of a number of wires.

(2) A solution for power distribution to a sectionized LED circuit board is provided. The present invention allows fasteners that fix the LED circuit board to realize distribution of power to each section of the LED circuit board so as to meet the need for length change for interconnecting sections of the LED circuit board and to eliminating the problem associated with power deterioration due to complicated parallel and serial connections of the multiple sections of the LED circuit board.

According to the present invention, a heat dissipation aluminum bar is provided for LED lighting, which is applicable to primary or secondary lighting to provide a breakthrough for lighting technology. In LED lighting, to accommodate lighting devices of various configuration and sizes, a heat dissipation aluminum bar or a circuit board used in the lighting device are often made in a multi-section form comprising a number of sections interconnecting each other. This is a current main stream of the industry and is the best solution so far. A lighting device that is formed of the sectionized structure requires consideration of power distribution for the parallel and/or serial connection and use of a heat dissipation aluminum bar. These factors are crucial to the success of a lighting device.

The arrangement of the present invention comprises an LED circuit board, a heat dissipation aluminum bar, and a plurality of fasteners that fixes the LED circuit board to the heat dissipation aluminum bar.

The LED circuit board comprises a plurality of sections interconnected to each other, each section having a surface on which one or more than one LED socket is formed for receiving and retaining therein one or a plurality of LED's. The circuit board forms at least two electrically conductive holes for respectively receiving the fasteners therethrough for fixing the circuit board in a receiving slot defined in the heat dissipation aluminum bar.

The fasteners serve as a major medium for electricity connection and are made of excellent metallic electrical conductor or are coated with excellent conductive layer on surfaces thereof so that the fasteners realize dual functions of fixing and electricity conduction. The fasteners extend through the at least two electrically conductive holes defined in the LED circuit board to get into contact with electrical power supply elements for realizing electricity supplying. Particularly, the electrically conductive holes are provided with surface ring layers that are made of conductors in electrical connection with the circuit board, whereby when secured by at least two fasteners, the electrically conductive holes may serve as positive and negative electrodes to supply direct current to the LED's and allow for efficient distribution of electrical power to each section of the circuit board. Electricity is supplied through electrically conductive bars that are received in power channels defined in the heat dissipation aluminum bar and enclosed by insulations.

The heat dissipation aluminum bar has a good nature of heat dissipation and has a structure that is composed of multiple heat dissipation fins and also comprises two structures of LED circuit board receiving slot and power channels. The LED circuit board receiving slot receives the LED circuit board to fix therein. The power channels each receive and retain therein an electrically conductive bar that is completely enclosed by insulation therein. Two power channels are provided to serve as positive and negative electrodes that play a major role of power supplying the present invention.

DESCRIPTION OF THE PRIOR ART

In the field of lighting, lighting devices have changed from the early incandescent bulbs to lighting tubes (fluorescent tubes) and then to the currently prevailing power-saving lighting tubes, such as PL tubes, and other power-saving bulbs (power-saving bulbs having ballasts). Significant improvement and modification have occurred in lighting devices in a very short period of time.

With the trend of environmental protection and development of substitute energy, lighting devices are one of the issues for carbon reduction. Although power saving lighting devices, such as PL tubes and power-saving bulbs, are readily available in the market, the total consumption of energy of a lamp is dependent on the quantity of lighting devices used. The greater the quantity is, the higher the consumption of power will be. Taking a fluorescent tube as an example, for a lamp system comprises four fluorescent tubes of 20 W, theoretically, the total power consumption of the lamp system is 20 W×4=80 W. This rule is also applicable t the PL tubes and the power-saving bulbs. The power-saving lighting devices mentioned above, although effective in reducing the power consumption, is still of higher electrical power consumption than light-emitting diodes are. Further, the traditional lighting tubes and bulbs are often encased by a glass enclosure, which is dangerous for potential risk of being broken. This is considered dangerous in the installation, handling, recycling, and transportation of the traditional lighting devices.

Apparently, LED's, which show a low consumption of power, provide a solution for lighting devices in respect of the above discussed problems. The LED's have several advantages, including high brightness, long projection, excellent lighting result, and low power consumption and these makes the LED's an excellent alternative for future lighting devices. Among these advantages, low power consumption and easy availability of material are the most important factors for LED's and these factors make the LED's the most attractive items for future lighting.

An LED is powered by direct current (DC) and most of the available power sources are alternate current (AC). Conversion between DC and AC is needed for driving an LED. Such a conversion generates heats, which together with the heat generated by the LED itself, need to be dissipated by using a heat dissipation module, otherwise the operation and service life of the LED will be affected. In this respect, aluminum made parts, such as bar and strip, for heat dissipation of LED's are also key components for LED lighting.

Aluminum bars or strips that are currently available in the market for heat dissipation for LED's have only the single function of dissipation of heat and are not integrated with the arrangement for power supply and power distribution. In this respect, no excellent solution of power transmission is available for LED lighting devices. Thus, the application of the LED lighting devices is subjected to undesired constraints in association with the length of circuit board arrangement and structures for supplying and distributing power, as well as power deterioration caused by complicated parallel and serial connections.

The up-to-date solution for these problems is to provide an external power supplying and distributing structure or an extension cable. The solution shows certain disadvantages of being difficult to install and complication of wire arrangement, which often leads to other undesired dangerous situation in the operation of the lighting device.

SUMMARY OF THE INVENTION

Thus present invention aims to provide a light-emitting diode (LED) heat dissipation aluminum bar and electricity conduction device, wherein an LED is provided with a power supply device that converts an alternate current into a direct current and the direct current is supplied to power channels formed in the structure of a heat dissipation aluminum bar, whereby with electrically conductive bars enclosed by insulations and the set in the power channels, when an LED circuit board is secured to the heat dissipation aluminum bar, fasteners are allowed to penetrate through the insulations to engage the electrically conductive bars for transmission of electricity from the electrically conductive bars to the LED circuit board and thus dual functions of fixing and electricity conduction can be realized at the same time.

The present invention is applied to an LED circuit board that is formed of multiple sections interconnected together and a proposed solution is an arrangement comprising an LED circuit board, a heat dissipation aluminum bar, and fasteners that secure the LED circuit board to the heat dissipation aluminum bar. Power distribution to each of the sections of the LED circuit board is realized through the fasteners that fix the section and supply of power is realized by the fasteners at the time when the fasteners fix the circuit board.

Thus, the use of the fasteners and the heat dissipation aluminum bar are based on insulations received in power channels defined in the heat dissipation aluminum bar and electrically conductive bars enclosed by the insulations, wherein the heat dissipation aluminum bar forms a receiving slot having a bottom defining two openings of the power channels and the insulations are set to have joint seams thereof in alignment with the openings. The electrically conductive bars are enclosed by the insulations to ensure electrical isolation thereof. The fasteners are received through electrically conductive holes defined in the circuit board and penetrate through the openings of the power channels for fixing. It is noted that the openings of the power channels have an opening width that is greater than the diameter of the fasteners, so that when the fasteners are applied, the fasteners do not get into contact with metallic portions of the power channels. The penetration and engagement of the fasteners with the insulations cause swelling of the insulation to thereby realize fixing and also allowing the fasteners to directly contact the electrically conductive bars enclosed inside the insulation to realize power transmission and distribution.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
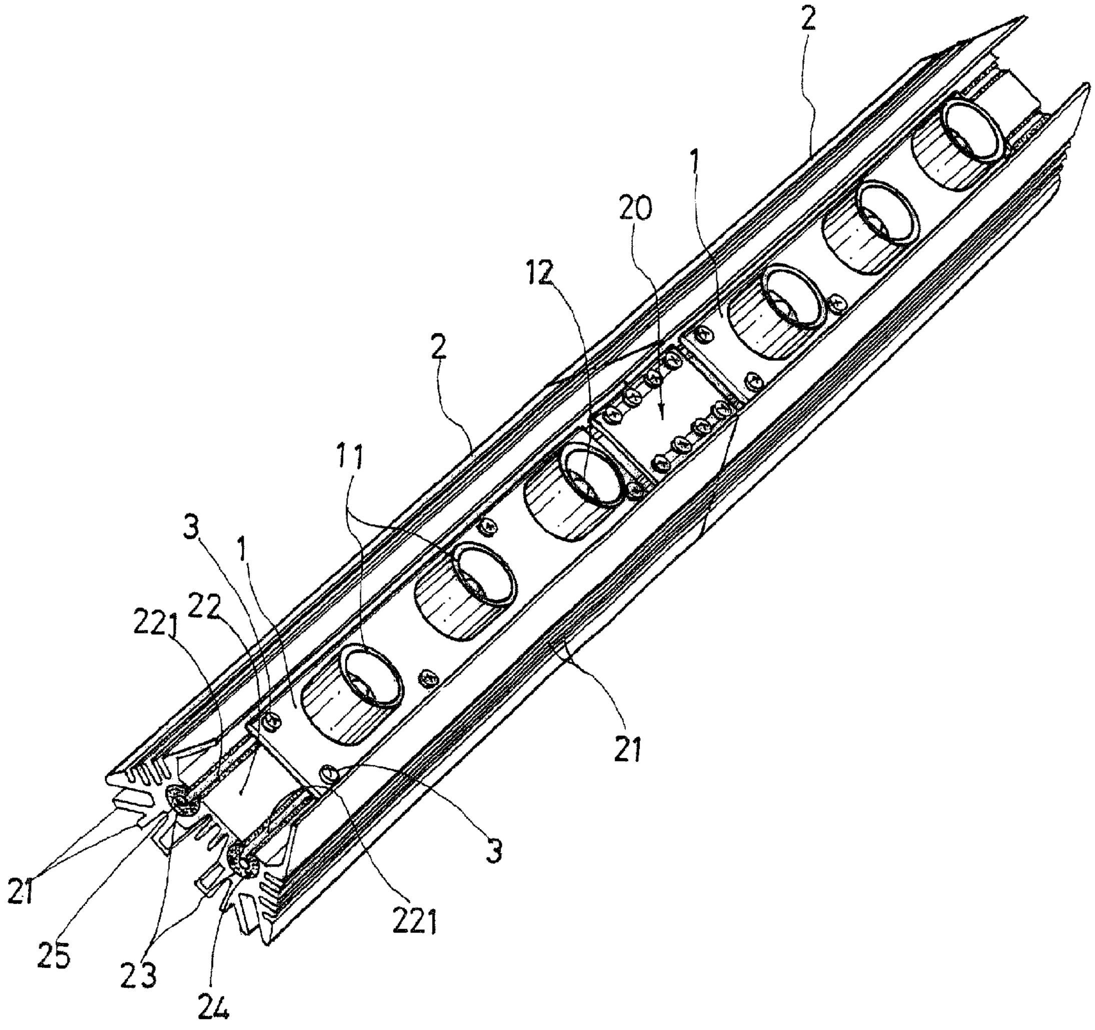
FIG. 1 shows a perspective view of a preferred embodiment of the present invention.

Referring to FIG. 1, the present invention is composed of a light-emitting diode (LED) circuit board 1, a heat dissipation aluminum bar 2, and fasteners 3 that fix the LED circuit board 1 to the heat dissipation aluminum bar 2. The present invention is intended to be applied to a sectionized of segmentized LED circuit board 1 that is composed of multiple sections or segments. Each section or segment of the LED circuit board 1 is fixed by at least two fasteners 3 serving as positive and negative electrodes for conduction of electricity so that a lighting device using the heat dissipation aluminum bar 2 as a heat dissipation module can be obtained.

As shown in FIG. 1, the heat dissipation aluminum bar 2 of the present invention is also made in the form of multiple sections interconnecting each other. Each section and an adjacent section of the LED circuit board 1 are connected by a coupling unit 20 to allow for expansion and adjustment of the total length of the heat dissipation aluminum bar 2 in order to match the length of the LED circuit board 1 and meet the needs of the lighting environment.

Figure 2:
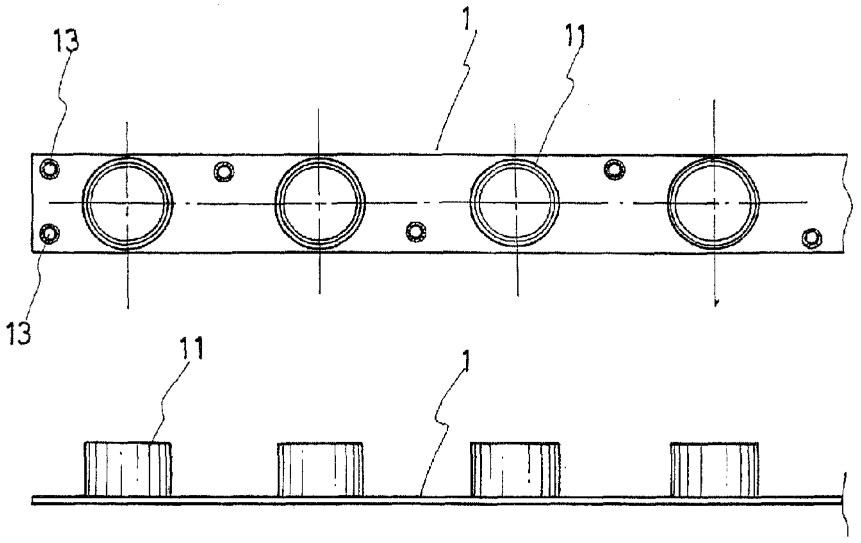
FIG. 2 shows a top plan view and a front view of a light-emitting diode (LED) circuit board according to the present invention.
Figure 3:
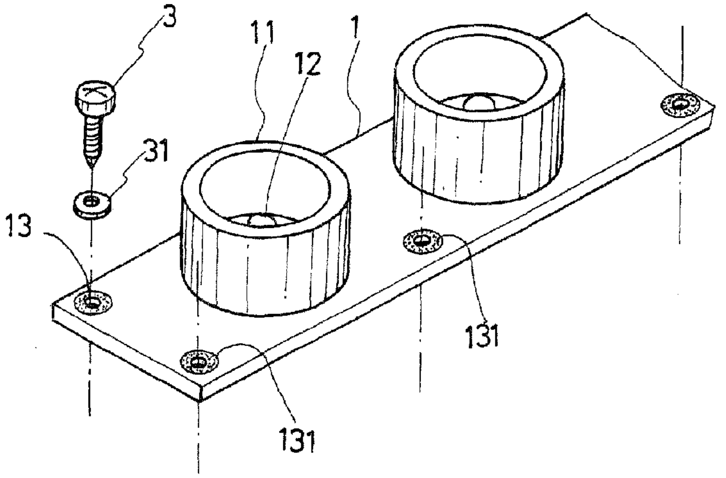
FIG. 3 shows the relationship between the LED circuit board and fasteners.

Reference is further made to FIGS. 2 and 3. FIG. 2 shows a single section of the LED circuit board 1 according to the present invention. The circuit board is provided with one or more than one LED sockets 11 for receiving one or a plurality of LED's 12 therein. The whole surface area of the circuit board section is provided with at least two electrically conductive holes 13 that receive the extension of the fasteners 3 therethrough. The electrically conductive holes each have an outer-surface ring layer 131 that are in electrical connection with the circuit board in order to transmit electricity to each of the LED sockets. The at least two fasteners 3 serve as positive and negative electrodes that supply electricity to the light-emitting diodes (see FIG. 3) and also allows for fast fixing the LED circuit board 1 in a receiving slot defined in the heat dissipation aluminum bar 2 and thus offer dual functions of fixing and electricity conduction.

Figure 4:
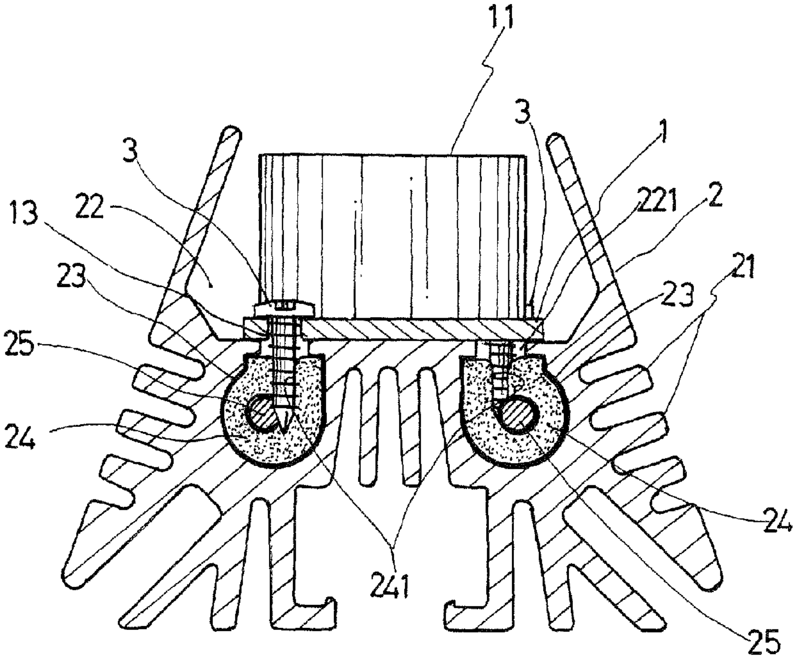
FIG. 4 shows a cross-sectional view of the present invention in an assembled form.

Referring to FIGS. 3 and 4, the fasteners 3 serve as a major medium for electricity connection and are made of excellent metallic electrical conductor. If desired, a washer 31 made of excellent metallic electric conductor can be further incorporated. Or alternatively the fasteners 3 and the washers 31 are coated with an excellent electricity conduction layer on surfaces thereof to provide the fasteners 3 with the dual functions of fixing and electricity conduction. Also referring to FIG. 4, the overall structure of the heat dissipation aluminum bar 2 according to the present invention is composed of multiple heat dissipation fins 21 and also comprises two structures of LED circuit board receiving slot 22 and power channels 23. The LED circuit board receiving slot 22 receives the LED circuit board 1 to fix therein and is formed in the whole area of a front surface of the heat dissipation aluminum bar 2. The power channels 23 receive and retain electrically conductive bars 25 that are enclosed by insulation 24 therein and has two openings 221, respectively for positive and negative electrodes, formed in a bottom of the receiving slot 22 of the heat dissipation aluminum bar 2, whereby the fasteners 3 are allowed, in a condition not in contact with two metallic side walls of each opening 221, to establish coupling with the insulation 24 received in the power channels 23. In other words, the opening 221 has an open width that is greater than the diameter of the fastener 3, and when the fastener 3 is properly set, and further due to guide realized through a joint seam 241 formed in the insulation 24, the fastener 3 is maintained not in contact with metallic portions of two side walls of the power channel 23 and is thus free of shorting.

As shown in FIG. 4, in alignment with two openings 221 formed in the bottom of the receiving slot 22 of the heat dissipation aluminum bar, the insulations 24 received in the power channels 23 form a joint seam 241 in a top thereof and the insulations 24 enclose the electrically conductive bars 25 so that electrical isolation of the electrically conductive bars 25 are realized by the insulations 24 to allow for transmission of large currents through the electrically conductive bars 25. The fasteners 3 are set to extend through the electrically conductive holes 13 of the circuit board 1 to directly penetrate through the openings 221 for engaging the joint seams 241 formed in the enclosing insulations, and this causes swelling and thus ensures fastening engagement. The fasteners 3 are thus allowed to be fixed to and in direct contact with the electrically conductive bars 25 enclosed in the insulations 24 to transmit electricity to the electrically conductive holes 13 defined in the LED circuit board 1. As such, the heat dissipation aluminum bar and the LED circuit board 1 can realize complete, efficient, and reliable electricity transmission and distribution therebetween.

To conclude, the present invention provides a novel idea, which has never been known before, and is thus believed to be a creation of improvement and imposing new, practical and widely applicable function to an LED heat dissipation aluminum bar or strip.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A light-emitting diode (LED) heat dissipation aluminum bar and electricity conduction device comprising an LED circuit board, a heat dissipation aluminum bar, and fasteners, and characterized in that:

the LED circuit board comprises a plurality of sections interconnected to each other, each section having a surface on which one or more than one LED socket is formed for receiving and retaining therein one or a plurality of LED's, the circuit board forming at least two electrically conductive holes for respectively receiving the fasteners therethrough for realizing electricity conduction of positive and negative electrodes so that fixing the circuit board in a receiving slot defined in the heat dissipation aluminum bar also realizes electricity conduction;

the heat dissipation aluminum bar is formed of multiple sections interconnected to each other and an overall structure of the heat dissipation aluminum bar is composed of multiple heat dissipation fins and also comprises two structures of LED circuit board receiving slot and power channels, the LED circuit board receiving slot receiving the LED circuit board to fix therein, the power channels receiving and retaining electrically conductive bars that are enclosed by insulation therein, two power channels being provided to serve as positive and negative electrodes for the LED's;

two openings are defined in a bottom of the receiving slot of the heat dissipation aluminum bar to communicate the power channels, the power channels each receiving therein an insulation that enclose the respective electrically conductive bar and forms a joint seam in a top thereof for the penetration of the respective fastener; and the fasteners serve as a major medium for electricity connection and are made of excellent metallic electrical conductor, the fasteners extending through the at least two electrically conductive holes defined in the LED circuit board and are further put through the insulations received in the power channels to engage the electrically conductive bars enclosed by the insulations.

2. The LED heat dissipation aluminum bar and electricity conduction device according to claim 1, wherein the electrically conductive holes comprise outer surface ring layers that realize electricity conduction with the fasteners.

3. The LED heat dissipation aluminum bar and electricity conduction device according to claim 1, wherein the electrically conductive holes comprise outer surface ring layers that are in electrical connection with the LED circuit board.

4. The LED heat dissipation aluminum bar and electricity conduction device according to claim 1, wherein the fasteners comprise a washer made of metallic electric conductor or wherein the fasteners and the washers are coated with an electricity conduction layer on surfaces thereof.

5. The LED heat dissipation aluminum bar and electricity conduction device according to claim 1, wherein the sections of the heat dissipation aluminum bar are connected by coupling units.

* * * * *